United States Patent [19]

Rupprecht et al.

[11] 4,312,681
[45] Jan. 26, 1982

[54] ANNEALING OF ION IMPLANTED III-V COMPOUNDS IN THE PRESENCE OF ANOTHER III-V COMPOUND HAVING HIGHER DISSOCIATION PRESSURE

[75] Inventors: Hans S. Rupprecht, Yorktown Heights; Jerry M. Woodall, Bedford Hills, both of N.Y.

[73] Assignee: International Business Machines Corporation, Armonk, N.Y.

[21] Appl. No.: 142,916

[22] Filed: Apr. 23, 1980

[51] Int. Cl.$^3$ .......................................... H01L 21/477
[52] U.S. Cl. .................................... 148/1.5; 148/175; 156/DIG. 73; 357/61
[58] Field of Search ................... 148/1.5, 175; 357/61; 156/DIG. 73

[56] References Cited

U.S. PATENT DOCUMENTS 3,070,467 12/1962 Fuller et al. .......................... 148/1.5
4,135,952 1/1979 Anderson et al. ..................... 148/1.5

OTHER PUBLICATIONS

Immorlica et al., Appl. Phys. Letts. 29 (1976), 94-95.
Kasahara et al., J. Appl. Phys. 50 (1979), 541-543.
Lee et al., in Ion Implantation in Semiconductors, 1976, Ed. Chernow et al., Plenuon, N. Y., pp. 115-122.

*Primary Examiner*—Upendra Roy
*Attorney, Agent, or Firm*—Bernard N. Wiener

[57] ABSTRACT

Practice of the disclosure reduces thermal decomposition and retains stoichiometry during annealing of a multiple element intermetallic semiconductor material by heating it in an environment with an excess of the most volatile constituent. In particular, practice of the disclosure is obtained by annealing a GaAs wafer with a surface into which Si has been implanted while the surface is in proximity to InAs.

18 Claims, 3 Drawing Figures

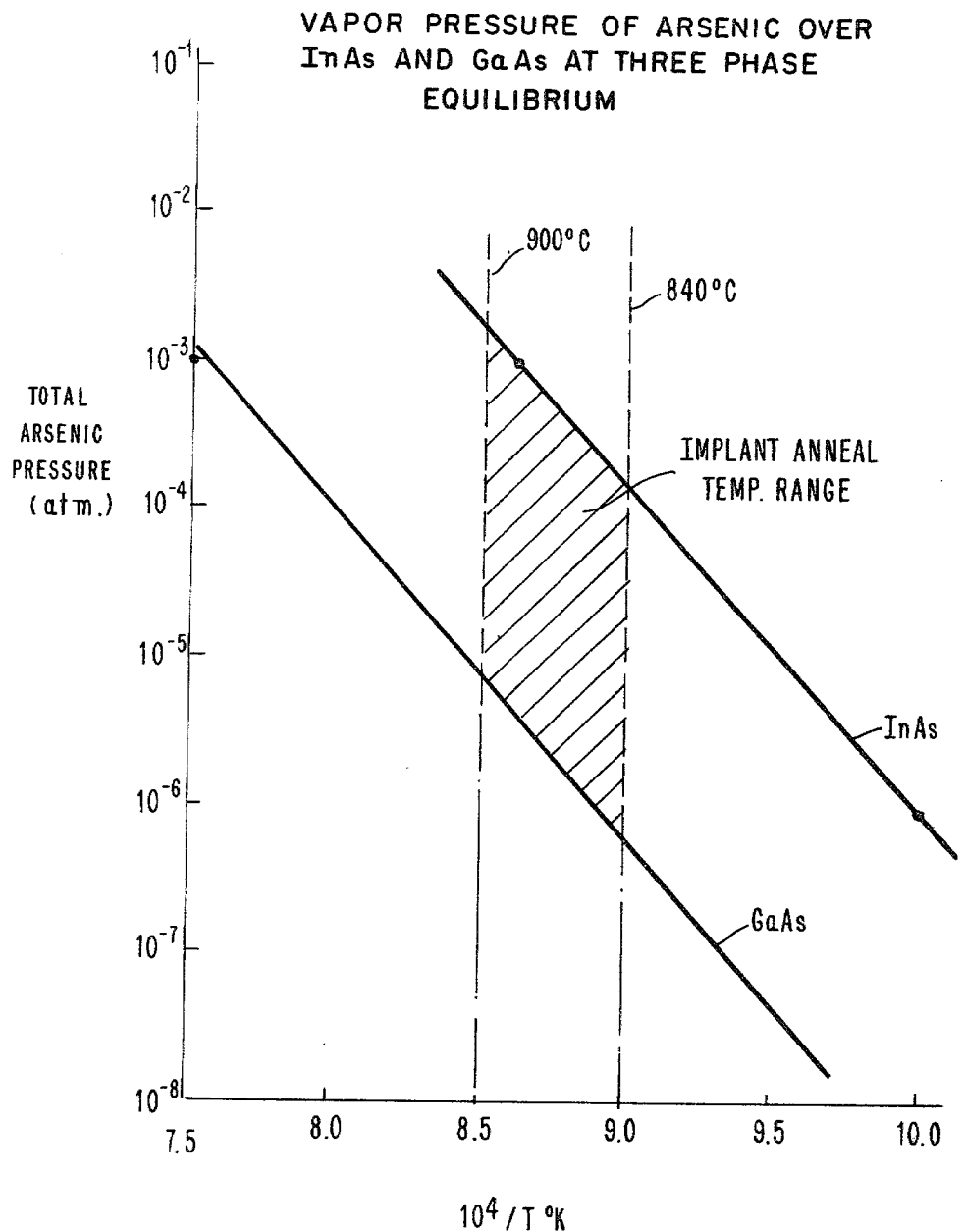

ANNEALING OF ION IMPLANTED III-V COMPOUNDS IN THE PRESENCE OF ANOTHER III-V COMPOUND HAVING HIGHER DISSOCIATION PRESSURE

BACKGROUND OF THE INVENTION

The annealing of an ion implanted III–V compound poses a problem where one of the constituents exhibits a high partial vapor pressure. Various capping techniques have been described in the prior art.

During the relatively high temperature annealing cycle for GaAs with Si implanted at a surface, the surface will decompose, due to the large partial pressure of As, if specific precautions are not taken. Heretofore, specific precautions have been such as capping with $Si_3N_4$ or AlN. Those capping films are directly applied to the surface and any thermal expansion mismatch results in undesirable surface strain on the GaAs. The implants are very shallow, about 2000 Å, for MESFET (metal-semiconductor field-effect transistor) application, and the surface quality is of extreme importance for the electrical behavior of the active layer. Another drawback of the prior art use of surface capping films is that frequently trace contamination by oxygen makes them permeable for Ga, which results in stoichiometric changes of the GaAs ion implanted surface layer.

The prior art does not disclose annealing an ion implanted GaAs wafer in close proximity to a piece of InAs. In the prior art, Anderson et al, U.S. Pat. No. 4,135,952, discloses annealing ion-implanted gallium arsenide wafers by enclosing the wafer in a liquid-tight but gas-porous container, immersing the container in a saturated solution of gallium arsenide in gallium, and maintaining the solution at the annealing temperature. Further, Fuller et al, U.S. Pat. No. 3,070,467, teaches preventing the evaporation of arsenic from gallium arsenide semiconductor materials during the heat treatment thereof by placing the gallium arsenide body near a quantity of solid arsenic in a sealed quartz tube and heating the tube within the range of 800°–1220° C.

SUMMARY OF THE INVENTION

It is an object of this invention to provide a method of annealing an ion implanted first III–V semiconductor of two or more constituents in the presence of a second III–V semiconductor of two or more constituents in which said second III–V semiconductor has a higher dissociation pressure than said first III–V semiconductor.

It is an object of this invention to reduce thermal decomposition and to retain stoichiometry during annealing of a multiple element intermetallic semiconductor material by heating it in an environment with an excess of the most volatile constituent.

It is another object of this invention to practice the foregoing object of this invention by annealing a GaAs wafer while it is in proximity to InAs material.

Practice of this invention provides for the annealing of ion implanted GaAs material which comprises placing a quantity of solid InAs in proximity to the ion implanted surface of the GaAs during the annealing temperature cycle.

The InAs retards thermal discomposition and inhibits loss of surface stoichiometry of the GaAs material.

The ion implanted species may comprise: any dopant elements such as S, Se, Te, Zn, Cd, amphoteric impurities, e.g., Ge, Si; or chemically and/or electrically inert elements such as Ar, Kr, Xe.

PRACTICE OF THE INVENTION

The invention comprises a capless annealing method for ion implanted GaAs which utilizes the thermal decomposition of InAs to establish a controlled arsenic atmosphere during the annealing. The arsenic pressure in equilibrium with thermally dissociated InAs is about 100 times larger than that for GaAs for annealing temperatures of in the approximate range 800° C. to 900° C. This provides a reliable and reproducible ambient for: (1) preventing thermal decomposition of the GaAs surface; (2) annealing radiation damage; and (3) controlling the activation of implanted impurities including the amphoteric impurities Si and Ge, for temperatures thus far studied as high as 900° C.

For example, using $SiF^+$ ions at an energy of about 400 KeV, the following results have been obtained: (1) for a dose of $5 \times 10^{13}$ cm$^{-2}$ and an anneal at 850° C. for 30 minutes, the sheet electron concentration $= 2.5 \times 10^{13}$ cm$^{-2}$, and the mobility was 1890 cm$^2$-V$^{-1}$-sec$^{-1}$; (2) for the same dose and an anneal at 900° C. for 30 minutes, the sheet carrier concentration $= 2.7 \times 10^{13}$ cm$^{-2}$ and the mobility was 2530 cm$^2$-V$^{-1}$-sec$^{-1}$. For doses of $5-10 \times 10^{12}$ cm$^{-2}$ and an anneal at 900° C. for 30 minutes, the activation is about 50 percent and the mobilities are greater than 4000 cm$^2$-V$^{-1}$-sec$^{-1}$. For Si implantation, this method produces an activation which is 3 to 5 times larger than for other techniques in which the As pressure equals the GaAs dissociation pressure, such as reported by C. L. Anderson et al in J. Electrochem. Soc. 127, 925 (1980).

BRIEF DESCRIPTION OF THE DRAWINGS

FIG. 3 is a graph of calculated values showing As vapor pressure at three phase equilibrium over either InAs or GaAs as a function of the reciprocal of the Kelvin (absolute) temperature.

EMBODIMENTS OF THE INVENTION

Figure 1:
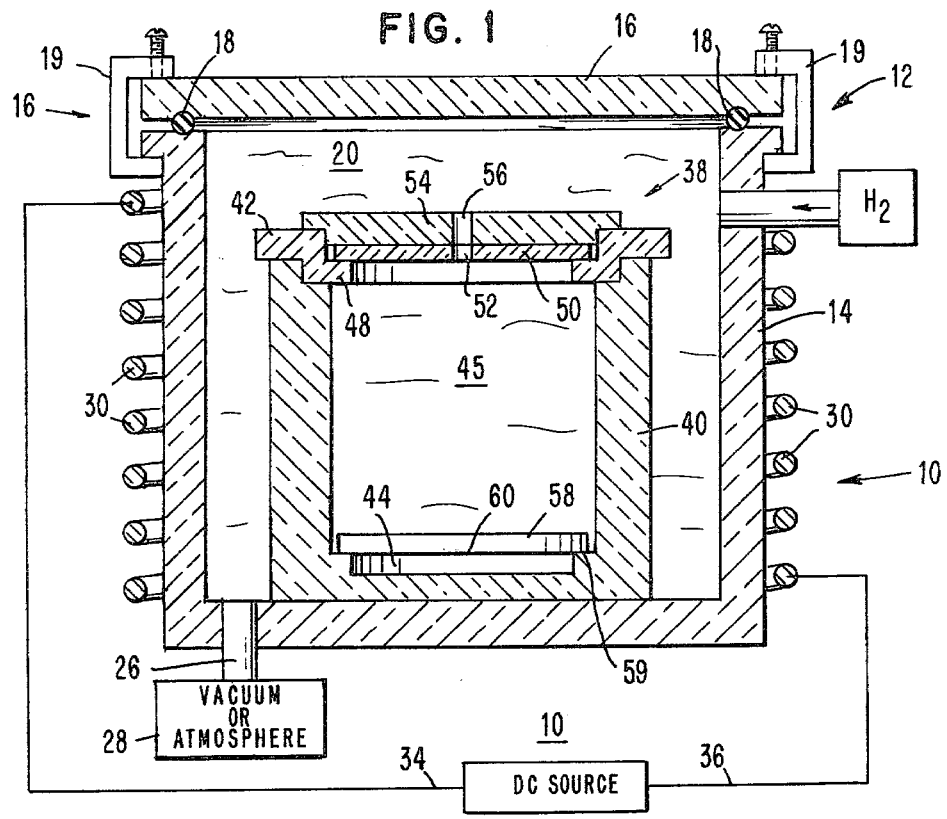
FIG. 1 comprises a cross-sectional depiction of apparatus by which an ion implanted GaAs example is annealed in the presence of a piece of InAs in a housing.
Figure 2:
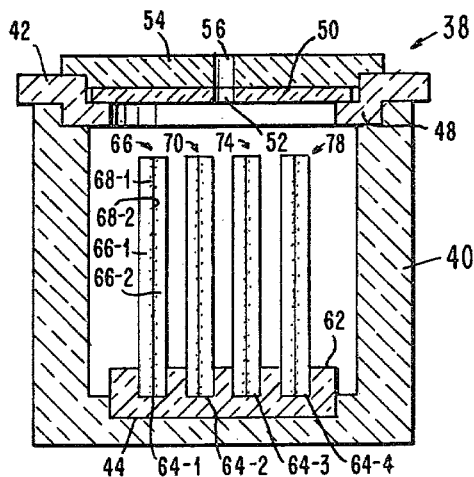
FIG. 2 comprises the same housing as FIG. 1 which is utilized to anneal several ion implanted GaAs examples in the presence of InAs.

The embodiments of the invention will be exemplified with reference to FIGS. 1 and 2 which illustrate a common apparatus for treating an example and several examples, respectively, in accordance with the principles of this invention.

In particular, FIG. 1 shows in cross-sectional depiction the embodiment 10 which comprises a furnace 12, which includes a housing 14 and lid 16 which is affixed to the housing 14 by O-ring 18 and clamp 19, defining a heating chamber 20. Both housing 14 and lid 16 are made of quartz. Hydrogen $H_2$ is introduced to chamber 20 via pipe 22 from hydrogen source 24. A vacuum is established in chamber 20 via pipe 26 by vacuum pump 28 before introducing $H_2$. Thereafter, $H_2$ continuously flows at a slight pressure over atmospheric pressure. The furnace 12 has a resistive heating coil 30 wound around housing 14 which is powered by electrical energy source 32 via electrical connections 34 and 36.

An especial device for containing and treating an example of GaAs is characterized by numeral 38 in FIG. 1. Device 38 comprises housing portion 40 with slip on lid 42 and partially removed portion 44 at the bottom of the defined chamber 45. Lid 42 has opening 46 therein and edge 48 protruding over chamber 45. A piece of InAs 50 is supported by edge 48 and has therein an opening 52. Situated at the top of device 38 is a capping portion 54, with an opening 56 therein to match the opening 52 in the InAs section, which sits upon the upper surface 57 of lid 42.

An example 58 of GaAs is supported by inner edge 59 with treated surface 60 above the chamber portion 44. Housing portion 40, lid 42, and capping portion 54 are made of quartz.

Electrical energy source 32 may be either A.C. or D.C. The chamber 20 and consequently the device 38 and the GaAs example 58 and InAs piece 50 are heated at a controlled temperature to effect the consequences for the practice of this invention. The operation of the embodiment 10 comprises essentially the heating of the GaAs example 58 and its treated surface 60 in the presence of the piece of InAs 50. The hydrogen gas $H_2$ is introduced via pipe 22 and orifices 56, 52 and 46 into the environment of surface 60 and permits the only interaction to occur which is resultant from the As pressures involved.

With reference to FIG. 2 the device 38 is shown arranged to treat a plurality of examples of GaAs with the same type piece InAs 50 as utilized for the treatment of the single examle of GaAs in FIG. 1. A support mount 62 resides in the opening 44. It has slots 64-1, 64-2, 64-3 and 64-4 which each hold two examples of GaAs with their treated faces juxtaposed to each other. Thus, the pair of examples of GaAs 66 comprising 66-1, 66-2 with their respective faces 68-1, 68-2 juxtaposed are shown in slot 64-1. It has been determined for the practice of this invention that it is especially advantageous for annealing the treated portions 68-1 and 68-2 that they be in approximate contact so that the overpressure of As is uniformly and intimately thereat. Comparably pairs of examples of GaAs 70, 74 and 78 are established in the slots 64-2, 64-3 and 64-4 respectively and treated comparably to the pair of GaAs examples 66.

EXAMPLES FOR THE INVENTION

Example I

An annealing procedure for GaAs has been developed. Previously, in order to prevent the decomposition and stoichiometry changes of a GaAs surface during annealing at temperatures above 600° C., it was necessary to encapsulate the GaAs wafer with $Si_3N_4$ or include powdered GaAs during the anneal step. However, there is loss of As during the anneal. In this example, the As over-pressure is supplied by the decomposition of an InAs wafer 50 placed near the GaAs wafer 58 in the device 58 (FIG. 1). For any given temperature, the As pressure over InAs is much greater than the As pressure over GaAs. Hence, when both are present in an almost sealed system, the As vapor pressure will be supplied by the decomposition of InAs. The results show that, after an anneal at 850° C. for 20 minutes, the GaAs surface presents no evidence of decomposition as measured by phase contrast microscopy.

Example II

An annealing method has been developed for implanted GaAs which permits the heat treatment without the customary $Si_3N_4$ coating. The decomposition pressure due to As is appreciably larger at the annealing temperatures for the InAs system than for GaAs. When the GaAs wafers (wafer 58 in FIG. 1 and wafer pairs 66, 70, 74 and 78 in FIG. 2) are heat treated in a limited volume 45 (FIGS. 1 and 2) in the presence of a piece of InAs 50, the decomposition of GaAs is prevented. GaAs wafers which were implanted with $SiF^+$ at room temperature and an energy of 390 keV were annealed in the described way at 850° C. and 900° C., respectively.

For an implant dose of $D = 5 \times 10^{13}$ Si/cm² the following values for the effective carrier density and Hall mobility were obtained:

850° C. anneal, $N_{s\text{-}eff} = 2.5 \times 10^{13}$ el/cm²,

  (1)

where $N_{s\text{-}eff}$ is the effective electron concentration in the implanted and annealed region and $\mu_{eff}$ is the effective electron mobility 1 in the implanted and annealed region.

900° C. anneal, $N_{s\text{-}eff} = 2.7 \times 10^{13}$ el/cm²,

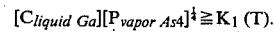  (2)

These values of (1) and (2) above compare well with the ones reported in the prior art literature using $Si_3N_4$ capping.

PRINCIPLES OF THE INVENTION

GaAs decomposes thermally according to the reaction $$GaAs_{(solid)} \rightarrow Ga_{liquid} + \tfrac{1}{4}As_4 \text{ vapor.}$$

It will stop when $$[C_{liquid\ Ga}][P_{vapor\ As4}]^{\frac{1}{4}} \geq K_1(T).$$

If the GaAs is in an unconfined system, the As vapor will be swept away and decomposition will proceed indefinitely causing loss of material and deterioration of surface quality and stoichiometry.

However, if InAs is placed in close proximity to the GaAs, it will decompose according to the reaction:

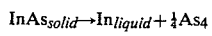

Decomposition will cease when

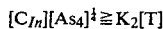

It is noted that for all T $$K_2[T] > K_1[T]$$

and thus $[P_{As4}]$(from InAs) > $[P_{As4}]$(from GaAs).

The vapor pressure of As over the GaAs can be varied by changing the composition of the InAs to $Ga_{1-x}In_xAs$ where $0 \leq x \leq 1$ or varied by changing the temperature of the InAs source relative to the GaAs.

FIG. 3 is a graph of calculated values showing As vapor pressure at three phase equilibrium over either InAs or GaAs as a function of the reciprocal of the Kelvin (absolute) temperature.

For implanted group IV elements in GaAs, the site selection and hence doping type is controlled during annealing by a Schottky equilibrium of arsenic and gallium vacancies which in turn is a function of the arsenic vapor pressure. This is expressed quantitatively as:

$$N_D/N_A = K[P_{As_4}]^{\frac{1}{2}}$$

where $N_D$ is the concentration of group IV element on the gallium (donor) atomic site and $N_A$ is the concentration of the group IV on the arsenic (acceptor) atomic site. Thus, by judicious choice of the As pressure during anneal, either n or p type conductivity can be obtained.

ASPECTS OF THE INVENTION

Aspect 1 of the invention comprises method of annealing ion implanted first III–V semiconductor of two or more constituents in the presence of a second III–V semiconductor of two or more constituents in which said second III–V semiconductor has a higher dissociation pressure than said first III–V semiconductor.

Aspects 2 to 5 of the invention comprise: (2) method of aspect 1 wherein said first III–V semiconductor is GaAs and said second III–V semiconductor is InAs; (3) method of aspect 2 wherein said annealing is in the approximate temperature range of 800° C. to 900° C.; (4) method of aspect 3 wherein said approximate temperature range is 840° C. to 900° C.; and (5) method of aspect 1 wherein said implanted ion is Si.

Aspect 6 of the invention comprises method of aspect 1 in which the dissociation pressure of said second III–V semiconductor is controlled to determine the atomic site selection of substitutional group IV type implanted elements in said first semiconductor.

Aspects 7 to 10 of the invention comprise: (7) method of aspect 4 wherein said selected site is the III site; (8) method of aspect 5 wherein said III site is the Ga site; (9) method of aspect 4 wherein said selected site is the V site; (10) method of aspect 7 wherein said V site is the As site.

Aspect 11 of the invention comprises method of annealing of ion implanted GaAs by placing a quantity of solid InAs in proximity with the implanted surface of the GaAs during the annealing temperature cycle. Aspects 12 and 13 of the invention comprise: (12) method of aspect 11 wherein the annealing temperature is in the approximate range of 800° C. to 900° C.; (12) method of aspect 12 wherein the approximate range is 840° C. to 900° C. Aspect 14 of the invention comprises method of aspect 11 wherein said proximity is close proximity.

Aspect 15 of the invention comprises method for reducing thermal decomposition and retaining stoichiometry during anneal of a multiple element intermetallic semiconductor material by heating said material in an environment with an excess of the most volatile constituent. Aspects 16 to 19 of the invention comprise: (16) method of aspect 15 wherein said intermetallic semiconductor material comprises a GaAs wafer with a surface into which Si has been implanted and said environment has an excess of As; (17) method of aspect 16 wherein said excess As is derived from a piece InAs in proximity to said GaAs wafer; (18) method of aspect 17 wherein said heating is in the approximate temperature range of 800° C. to 900° C.; and (19) method of aspect 18 wherein said approximate temperature range is 840° C. to 900° C.

Having thus described our invention, what we claim as new, and desire to secure by Letters Patent is:

1. Method of annealing an ion implanted first III–V semiconductor of two or more constituents in the presence of a second III–V semiconductor of two or more constituents in which said second III–V semiconductor has a higher dissociation pressure than said first III–V semiconductor for reducing thermal decomposition and retaining stoichiometry therein during said annealing thereof.

2. Method of annealing an ion implanted first III–V semiconductor of two or more constituents in the presence of a second III–V semiconductor of two or more constituents in which said second III–V semiconductor has a higher dissociation pressure than said first III–V semiconductor for reducing thermal decomposition and retaining stoichiometry therein during said annealing thereof, wherein said first III–V semiconductor is GaAs and said second III–V semiconductor is InAs.

3. Method of claim 2 wherein said annealing is in the approximate temperature range 800° C. to 900° C.

4. Method of claim 3 wherein said approximate temperature range is 840° C. to 900° C.

5. Method of annealing an ion implanted first III–V semiconductor of two or more constituents in the presence of a second III–V semiconductor of two or more constituents in which said second III–V semiconductor has a higher dissociation pressure than said first III–V semiconductor for reducing thermal decomposition and retaining stoichiometry therein during said annealing thereof, wherein said implanted ion is Si.

6. Method of annealing ion implanted first III–V semiconductor of two or more constituents in the presence of a second III–V semiconductor of two or more constituents in which said second III–V semiconductor has a higher dissociation pressure than said first III–V semiconductor for reducing thermal decomposition and retaining stoichiometry therein during said annealing thereof, and in which the dissociation pressure of said second III–V semiconductor is controlled to determine the atomic site selection of substitutional group IV type implanted elements in said first semiconductor.

7. Method of claim 6 wherein said selected site is the III site.

8. Method of claim 7 wherein said III site is the Ga site.

9. Method of claim 6 wherein said selected site is the V site.

10. Method of claim 9 wherein said V site is the As site.

11. In the method of annealing of ion implanted GaAs, the improvement comprising:
    placing a quantity of solid InAs in proximity with the implanted surface of the GaAs for reducing thermal decomposition and retaining stoichiometry therein during the annealing temperature cycle.

12. Method of claim 11 wherein said annealing temperature is in the approximate range of 800° C. to 900° C.

13. Method of claim 12 wherein said approximate temperature range is 840° C. to 900° C.

14. Method for reducing thermal decomposition and retaining stoichiometry during anneal of a multiple element intermetallic semiconductor material comprising the step of heating said material in an environment with an excess of the most volatile constituent,
    wherein said intermetallic semiconductor material comprises a GaAs wafer with a surface into which Si has been implanted and said environment has an excess of As which is derived from a piece of InAs in proximity to said GaAs wafer.

15. Method of claim 14 wherein said heating is in the approximate temperature range of 800° C. to 900° C.

16. Method of claim 15 wherein said approximate temperature range is 840° C. to 900° C.

17. Method of claim 11 wherein said GaAs comprises at least two separate said surfaces of GaAs which are juxtaposed to each other.

18. Method of claim 17 wherein said two separate surfaces of GaAs are in approximate contact so that the over-pressure of As is uniformly and intimately thereat.

* * * * *